United States Patent
Yanagi et al.

(10) Patent No.: US 8,531,875 B2
(45) Date of Patent: Sep. 10, 2013

(54) MAGNETIC MEMORY

(75) Inventors: Satoshi Yanagi, Kawasaki (JP); Eiji Kitagawa, Yokohama (JP); Masahiko Nakayama, Yokohama (JP); Jyunichi Ozeki, Yokohama (JP); Hisanori Aikawa, Yokohama (JP); Naoharu Shimomura, Tokyo (JP); Masatoshi Yoshikawa, Yokohama (JP); Minoru Amano, Sagamihara (JP); Shigeki Takahashi, Yokohama (JP); Hiroaki Yoda, Sagamihara (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 31 days.

(21) Appl. No.: 13/426,139

(22) Filed: Mar. 21, 2012

(65) Prior Publication Data

US 2012/0230091 A1 Sep. 13, 2012

Related U.S. Application Data

(63) Continuation of application No. PCT/JP2009/066551, filed on Sep. 24, 2009.

(51) Int. Cl.
*H01L 29/82* (2006.01)
*G11C 11/15* (2006.01)

(52) U.S. Cl.
USPC .............. 365/158; 257/421; 257/E29.323

(58) Field of Classification Search
None
See application file for complete search history.

(56) References Cited

U.S. PATENT DOCUMENTS

2002/0167059 A1\* 11/2002 Nishimura et al. ........... 257/421
2006/0220084 A1  10/2006 Umehara et al.

FOREIGN PATENT DOCUMENTS

| JP | 2004-193595 A | 7/2004 |
| JP | 2006-261592 A | 9/2006 |
| JP | 2007-281171 A | 10/2007 |
| JP | 2008-248633 A | 10/2008 |
| JP | 2009-194393 A | 8/2009 |

OTHER PUBLICATIONS

F. J. Albert et al., "Spin-polarized current switching of a Co thin film nanomagnet", Applied Physics Letters, vol. 77, No. 23, Dec. 4, 2000, pp. 3809-3811 and cover page.
International Search Report issued Nov. 2, 2009 in PCT/JP2009/066551 filed Sep. 24, 2009 (with English Translation).
Written Opinion Report issued Nov. 2, 2009 in PCT/JP2009/066551 filed Sep. 24, 2009.

\* cited by examiner

*Primary Examiner* — Hoai V Ho
*Assistant Examiner* — James G Norman
(74) *Attorney, Agent, or Firm* — Oblon, Spivak, McClelland, Maier & Neustadt, L.L.P.

(57) ABSTRACT

According to one embodiment, a magnetic memory includes at least one memory cell including a magnetoresistive element, and first and second electrodes. The element includes a first magnetic layer, a tunnel barrier layer, a second magnetic layer, and a third magnetic layer provided on the second magnetic layer and having a magnetization antiparallel to the magnetization direction of the second magnetic layer. A diameter of an upper surface of the first magnetic layer is smaller than that of a lower surface of the tunnel barrier layer. A diameter of a lower surface of the second magnetic layer is not more than that of an upper surface of the tunnel barrier layer.

9 Claims, 12 Drawing Sheets

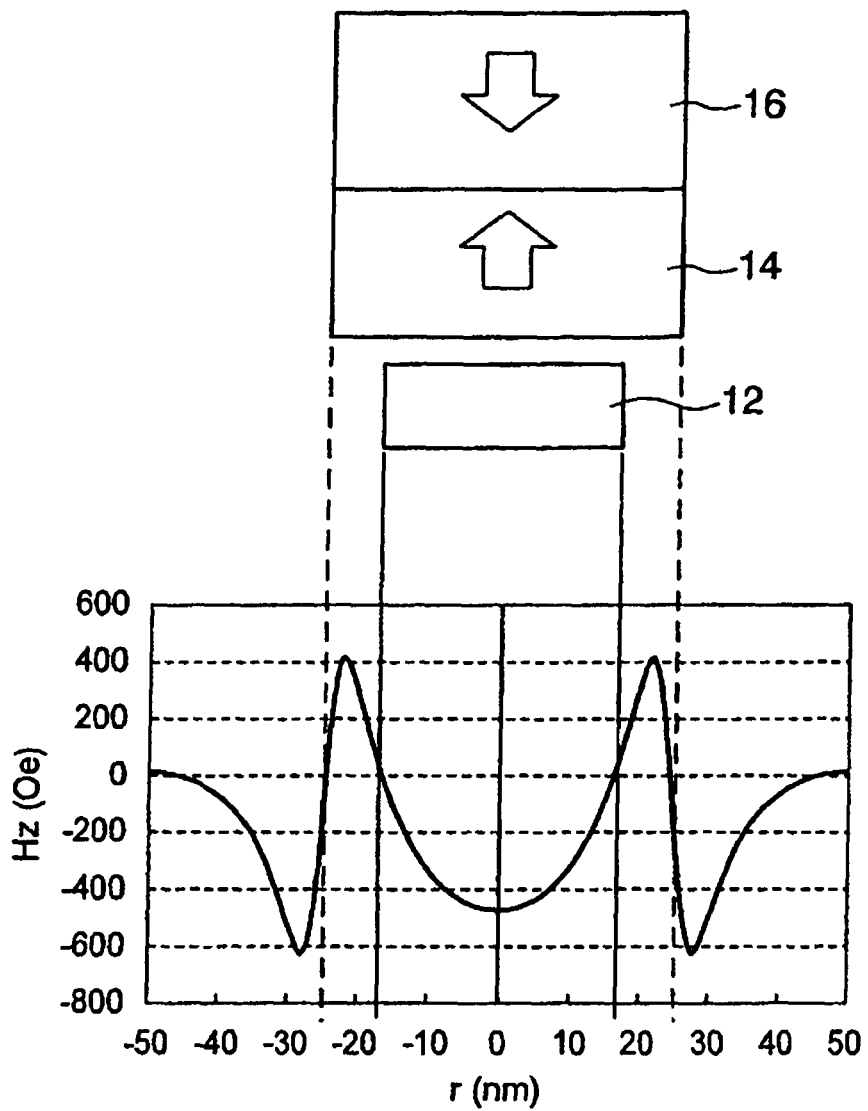
F I G. 6

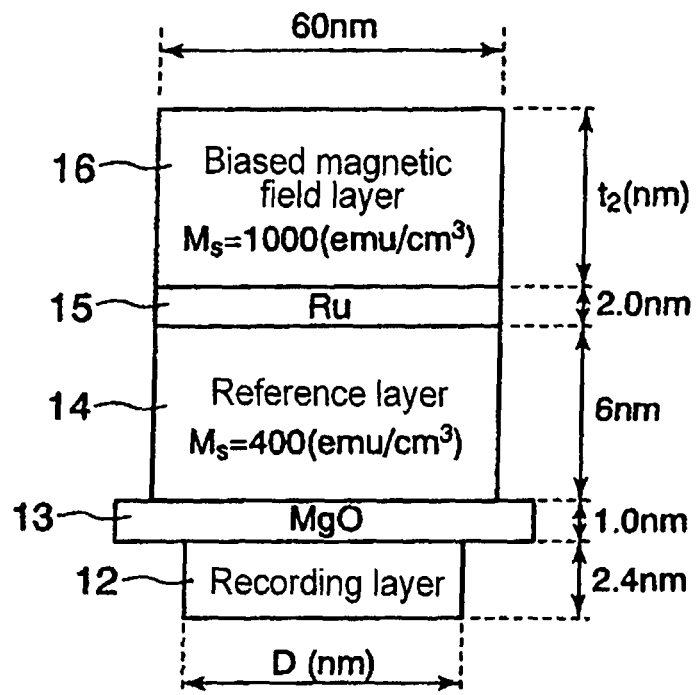
F I G. 7A
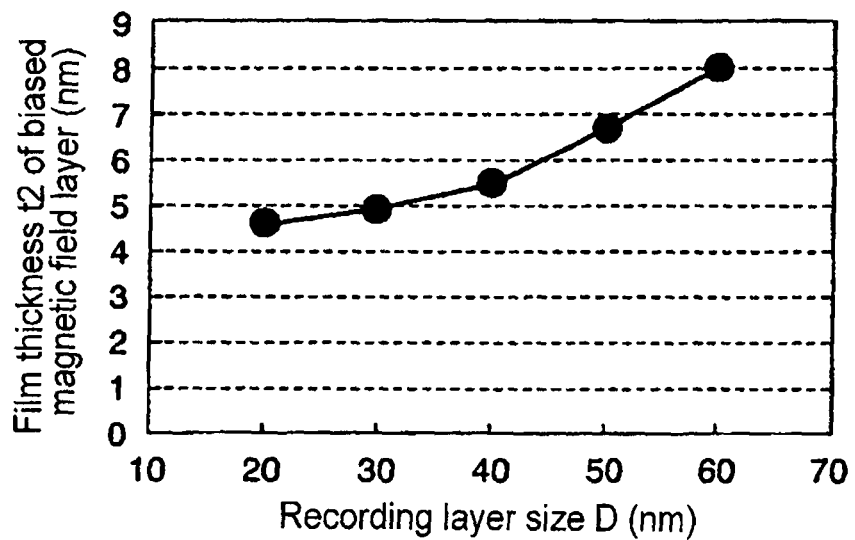
F I G. 7B

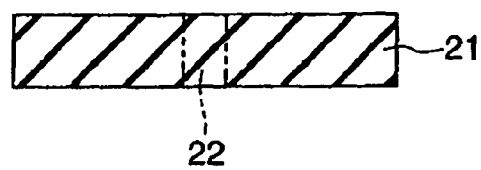
F I G. 8A
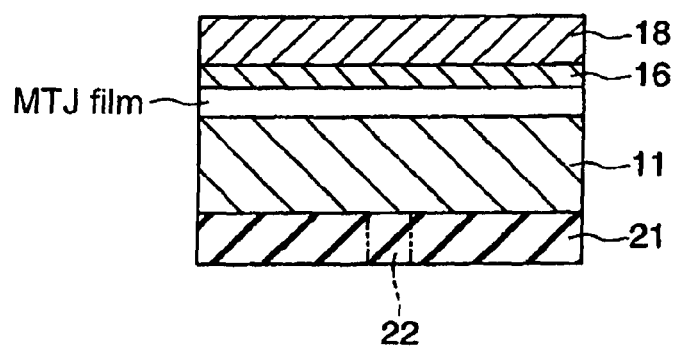
F I G. 8B
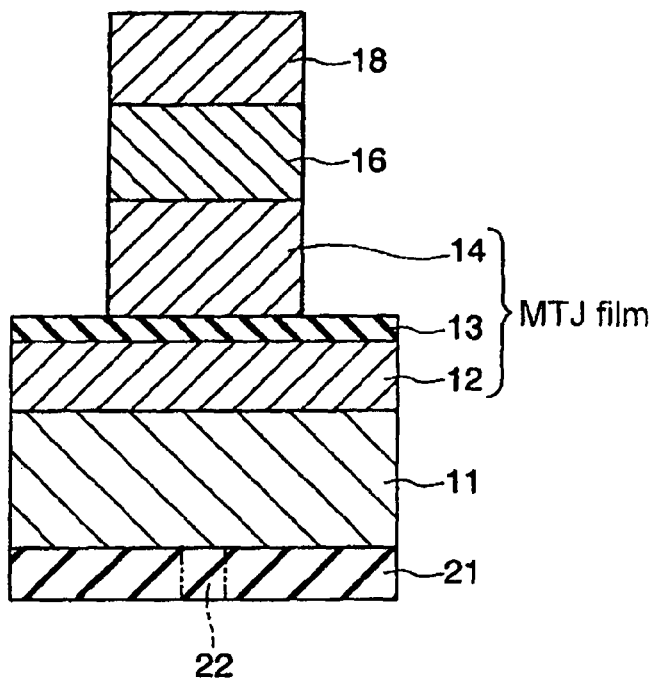
F I G. 9

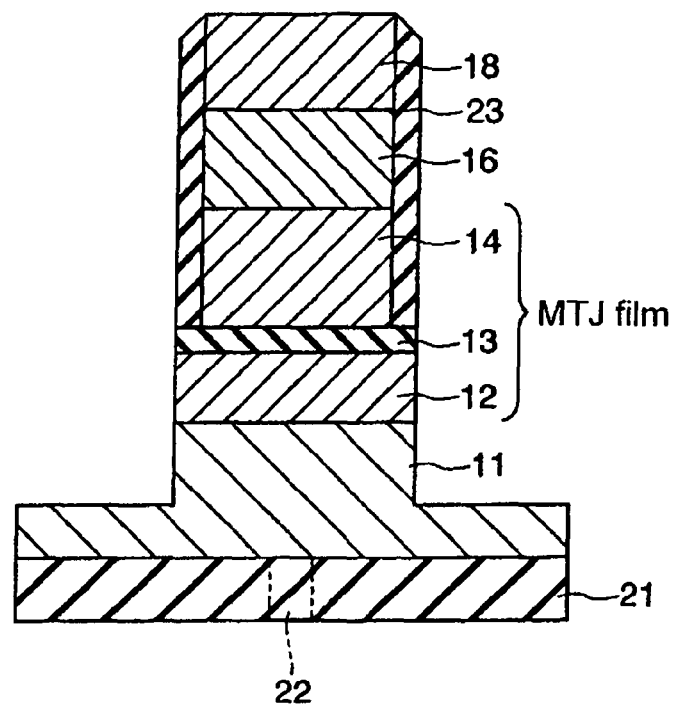
F I G. 12
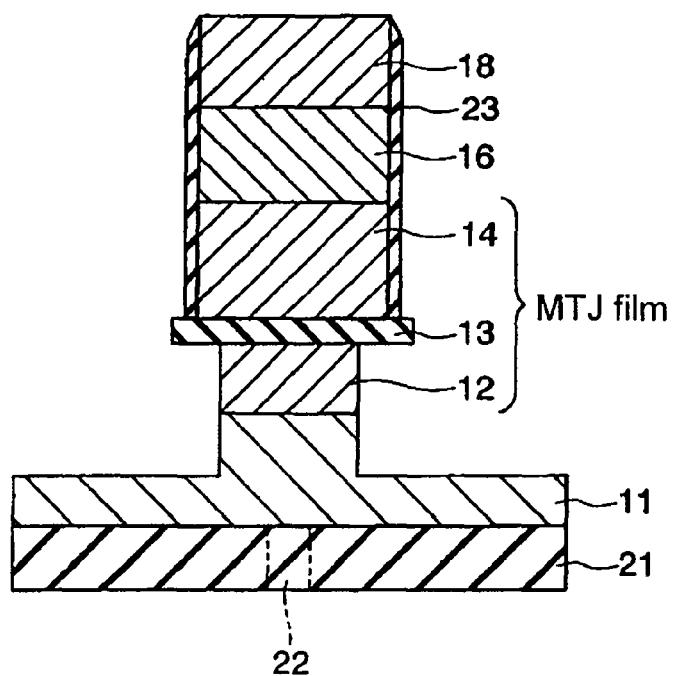
F I G. 13

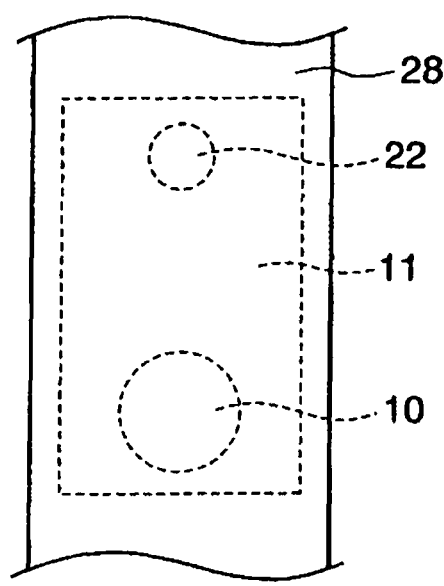
F I G. 16B
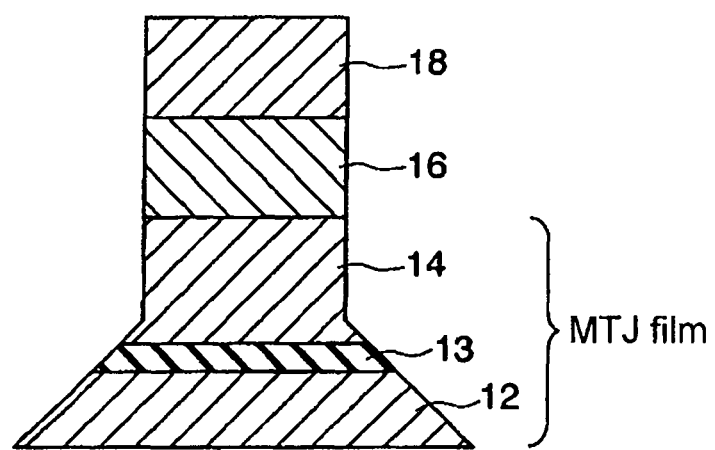
F I G. 17

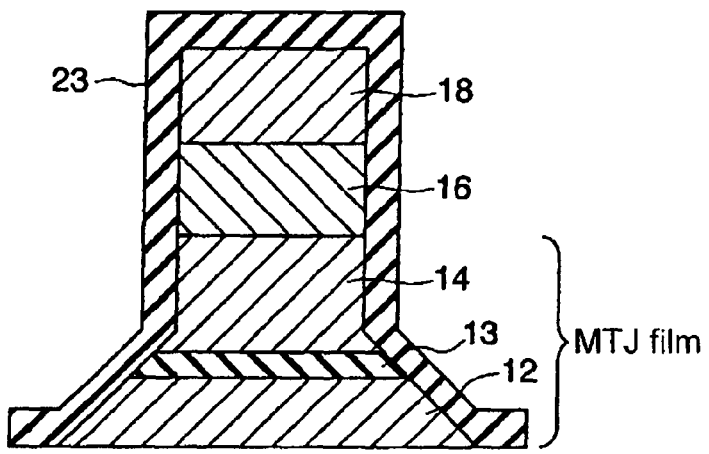
F I G. 18
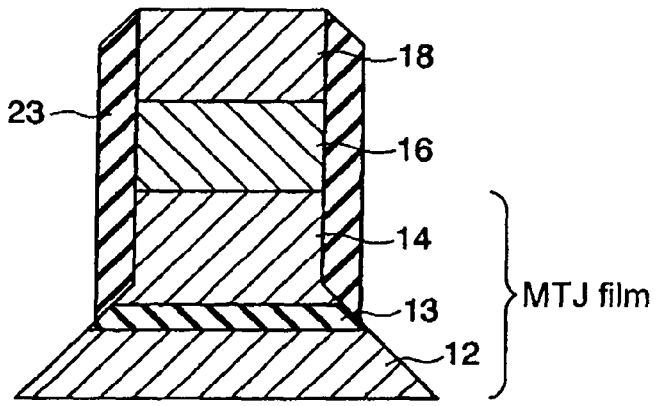
F I G. 19
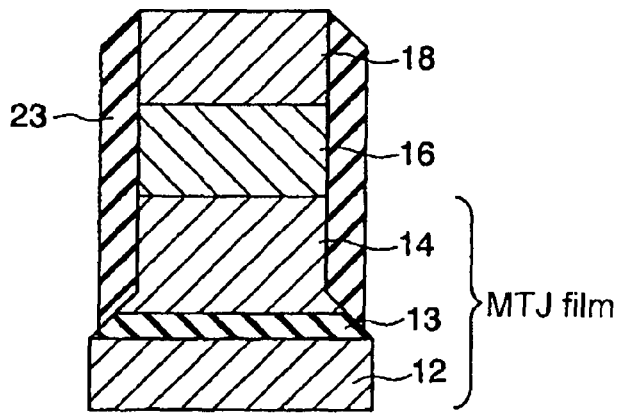
F I G. 20

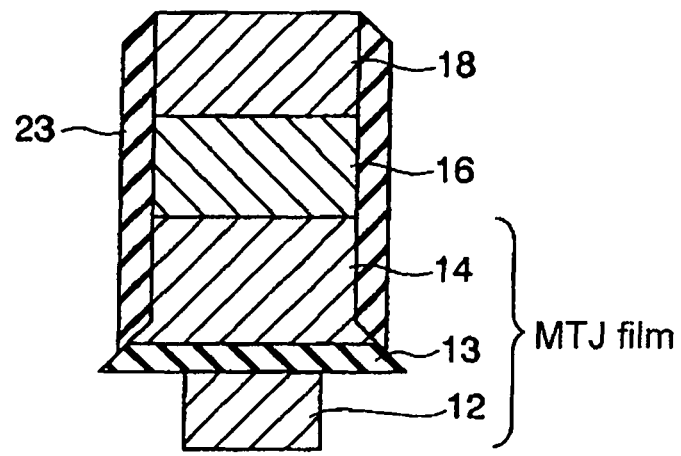
F I G. 21
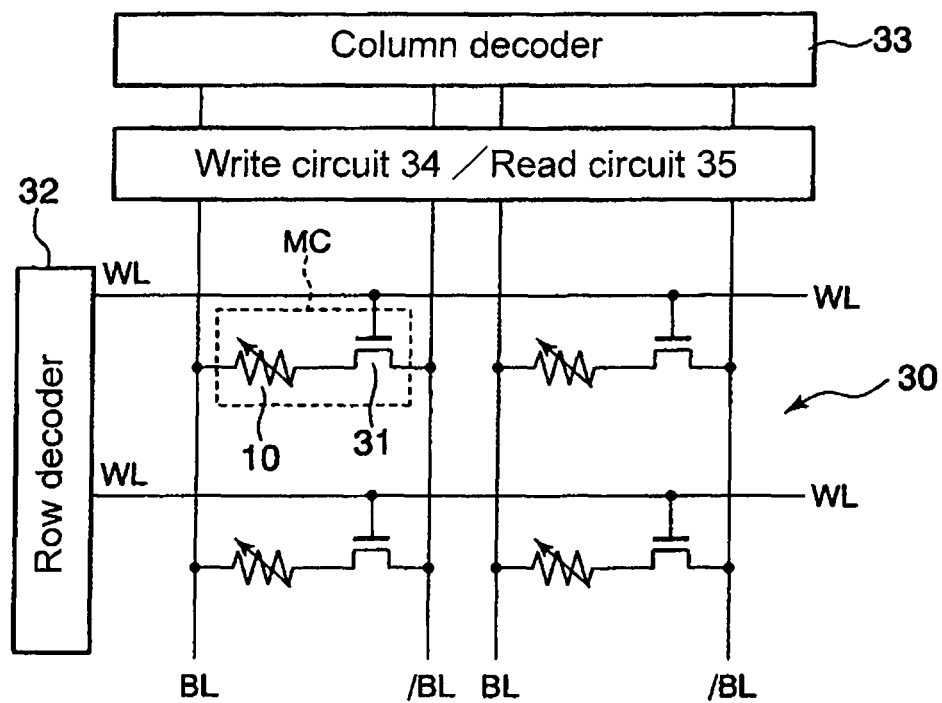
F I G. 22

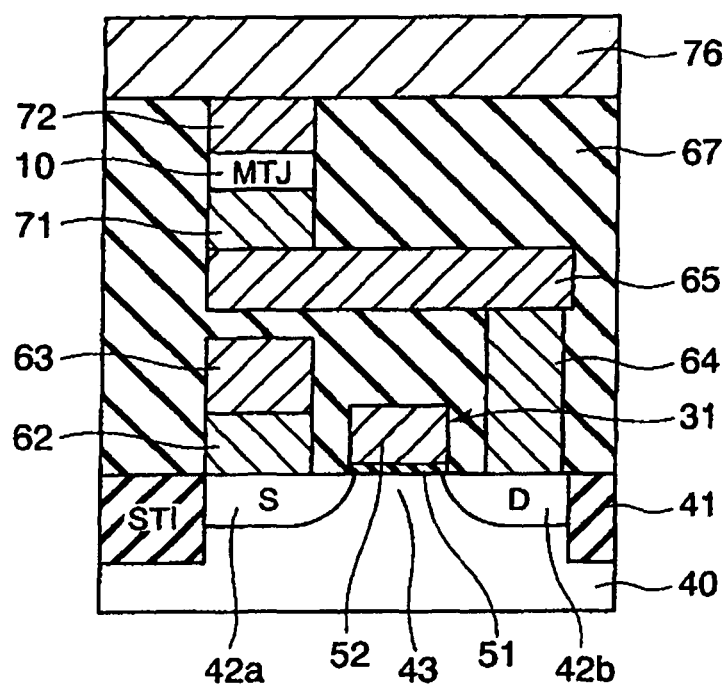
F I G. 23

MAGNETIC MEMORY

CROSS-REFERENCE TO RELATED APPLICATIONS

This application is a Continuation Application of PCT Application No. PCT/JP2009/066551, filed Sep. 24, 2009, the entire contents of which are incorporated herein by reference.

FIELD

Embodiments described herein relate generally to a magnetic memory.

BACKGROUND

There is conventionally known a method of applying a magnetic field to control the magnetization direction of a magnetic body. For example, in an HDD (Hard Disk Drive), the magnetization direction of the medium is reversed by a magnetic field generated by the recording head, thereby performing write. In a conventional MRAM (Magnetic Random Access Memory), a current is supplied to an interconnection provided near the magnetoresistive element, and a thus generated current-induced magnetic field is applied to the cell, thereby controlling the magnetization direction of the cell. Such a current-induced magnetic field writing method that controls the magnetization direction by an external magnetic field has a long history and can be said to be an established technology.

On the other hand, the recent advance of nanotechnology enables remarkable microfabrication of a magnetic material, and the need for locally controlling magnetization on the nanometer scale has arisen. However, localization of a magnetic field is difficult because it characteristically spatially spreads in principle. When selecting a specific storage unit area (bit) or memory cell and controlling its magnetization direction, the smaller the size of the bit or memory cell is, the more conspicuous the problem of "crosstalk", that is, a magnetic field reaching an adjacent bit or memory cell is. In addition, when the magnetic field generation source is made smaller to localize the magnetic field, the magnetic field enough to control the magnetization direction cannot be generated.

As a technique of solving these problems, a "spin transfer torque method" is known which causes magnetization reversal by supplying a current to a magnetic body (for example, non-patent literature 1).

In this spin transfer torque method, a spin electric current is supplied to a magnetoresistive element as a write current. Magnetization reversal is executed using thus generated spin-polarized electrons. More specifically, the angular momentum of the spin-polarized electrons is transmitted to the electrons in the magnetic material serving as a magnetic recording layer so as to reverse the magnetization of the magnetic recording layer.

Using the spin transfer torque method makes it possible to easily locally control the magnetization state on the nanometer scale and also reduce the value of the spin electric current in accordance with the microfabrication of the magnetic material. This contributes to implementing a spin electronics device such as a hard disk drive or magnetic random access memory having a high recording density.

For example, a magnetic random access memory comprises, as a memory element, a magnetoresistive element having an MTJ (Magnetic Tunnel Junction) film using a TMR (Tunneling Magnetoresistive) effect. The MTJ film includes three thin films, that is, a recording layer and a reference layer which are made of a magnetic material, and a tunnel barrier layer sandwiched between them. Information is stored based on the magnetization states of the recording layer and the reference layer. In a spin transfer torque MRAM using the spin transfer torque method, information write to a magnetoresistive element is done by supplying a current in a direction perpendicular to the surface of the MTJ film.

As the magnetic layers used in the magnetoresistive element, a perpendicular magnetization film in which magnetization occurs in a direction perpendicular to the film surface and an in-plane magnetization film in which magnetization occurs in the in-plane direction are known. When the perpendicular magnetization film is adopted, the leakage magnetic field generated by magnetization of the reference layer is perpendicular to the film surface of the recording layer. Hence, the magnetic field having a large perpendicular component acts on the recording layer. The leakage magnetic field generated from the reference layer and acting on the recording layer acts in a direction to make the magnetization of the recording layer parallel to the magnetization of the reference layer. For this reason, a small spin electric current suffices to reverse the magnetization of the recording layer from antiparallel to parallel. Conversely, a large current is needed to reverse the magnetization from parallel to antiparallel.

Assume that the antiparallel state is unstable because of the leakage magnetic field. In this case, if the leakage magnetic field is larger than the coercive force of the recording layer, it is impossible to hold the magnetization of the magnetoresistive element in the antiparallel state without magnetic field application from outside of the magnetoresistive element. Even if the leakage magnetic field is smaller than the coercive force of the recording layer, the antiparallel state is reversed to the parallel state due to thermal agitation during the antiparallel state maintained for a long time, and the information cannot be held. Hence, the leakage magnetic field from the reference layer needs to be much smaller than the coercive force of the recording layer.

On the other hand, a double junction structure has been proposed in which reference layers are arranged on the upper and lower sides of a recording layer while inserting nonmagnetic layers between them. When the double junction structure is applied to the magnetoresistive element using the perpendicular magnetization films, the magnetization directions of the two reference layers are set to be antiparallel to each other. In this case, the perpendicular components of the leakage magnetic fields generated from the two reference layers and acting on the recording layer face in directions opposite to each other. For this reason, when saturation magnetizations Ms and the thicknesses of the two reference layers are adjusted to be almost the same, the z components (components perpendicular to the film surfaces) of the leakage magnetic fields can almost be canceled.

However, the radial-direction components of the leakage magnetic fields act in directions to strengthen each other. Especially, a large lateral magnetic field acts on the outer periphery of the recording layer. This lateral magnetic field deteriorates the perpendicularity and magnetoresistive characteristics of the magnetization and also degrades the uniformity of magnetization reversal of the recording layer. Additionally, in the double junction structure, the two reference layers need to be antiparallel to each other. To do this, the two reference layers need to have a sufficient coercive force difference and be magnetized separately, resulting in limitations on the degree of freedom of the material, structure, and process conditions.

The magnetoresistive element has a stacked structure in which the recording layer and the reference layer are stacked with the thin tunnel barrier layer sandwiched between them, and the distance between the recording layer and the reference layer is short. When working the stacked structure to form the magnetoresistive element, the recording layer and the reference layer which contain a magnetic metal are removed together with the tunnel barrier layer. Hence, metal readherents may readhere to the side surface of the stacked structure across the tunnel barrier layer. In this case, another leakage current path is formed by the readherents. This causes a short circuit between the recording layer and the reference layer and makes the magnetoresistive element defective, resulting in a decrease in the yield of magnetoresistive elements.

The present applicant has applied a magnetoresistive element in which a magnetic layer is provided on a surface of the reference layer opposite to a tunnel barrier layer so as to cancel the leakage magnetic field from the reference layer. However, since the magnetic layer is very thick, and the height of the stacked film including the reference layer, the tunnel barrier layer, and the recording layer largely increases. For this reason, when patterning the stacked film, the shape of the stacked film may vary, resulting in a variation in the characteristics of the magnetoresistive elements.

BRIEF DESCRIPTION OF THE DRAWINGS

FIG. 6 is a view showing the simulation result of the magnetization distribution in the recording layer when a biased magnetic field layer having a film thickness necessary for canceling the leakage magnetic field from the reference layer in the magnetoresistive element according to the comparative example is used in the magnetoresistive element of the first embodiment.

FIG. 7A is a view showing the characteristics of the layers used in the simulation.

FIG. 7B is a graph showing the simulation result representing the relationship between the diameter of the recording layer and the film thickness of the biased magnetic field layer.

FIGS. 8A and 8B are sectional views showing a manufacturing method according to the second embodiment.

FIG. 9 is a sectional view showing the manufacturing method according to the second embodiment.

FIG. 12 is a sectional view showing the manufacturing method according to the second embodiment.

FIG. 13 is a sectional view showing the manufacturing method according to the second embodiment.

FIG. 16B is a plan view of a magnetoresistive element manufactured by the manufacturing method according to the second embodiment.

FIG. 17 is a sectional view showing a manufacturing method according to the third embodiment.

FIG. 18 is a sectional view showing the manufacturing method according to the third embodiment.

FIG. 19 is a sectional view showing the manufacturing method according to the third embodiment.

FIG. 20 is a sectional view showing the manufacturing method according to the third embodiment.

FIG. 21 is a sectional view showing the manufacturing method according to the third embodiment.

FIG. 22 is a circuit diagram of a magnetic memory according to the fourth embodiment.

FIG. 23 is a sectional view of a memory cell of the magnetic memory according to the fourth embodiment.

DETAILED DESCRIPTION

Figure 1:
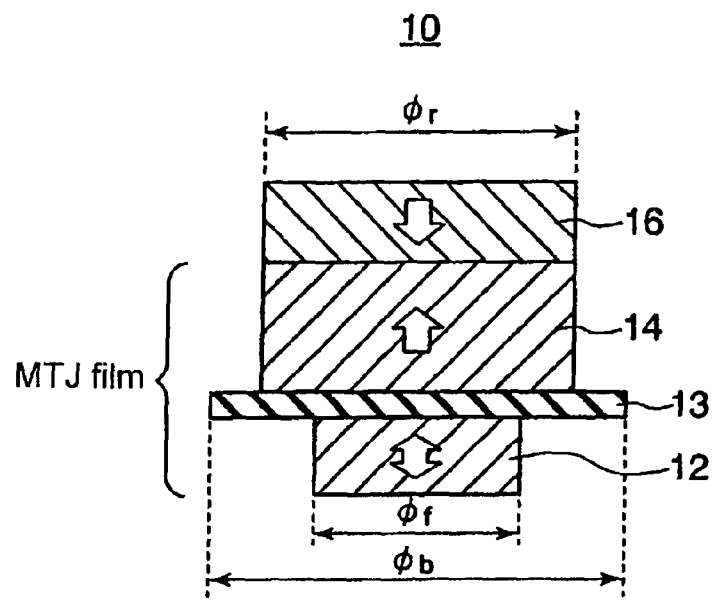
FIG. 1 is a sectional view showing a magnetoresistive element used in an MRAM according to the first embodiment.

In general, according to one embodiment, a magnetic memory includes at least one memory cell. The memory cell comprises a magnetoresistive element serving as a memory element, and a first electrode and a second electrode which are electricity connected to the magnetoresistive element. The magnetoresistive element comprises a first magnetic layer having a magnetization direction that is substantially perpendicular to a film surface and variable, a tunnel barrier layer provided on the first magnetic layer, a second magnetic layer provided on the tunnel barrier layer and having a magnetization direction that is substantially perpendicular to a film surface and invariable, and a third magnetic layer provided on the second magnetic layer and having a magnetization antiparallel to the magnetization direction of the second magnetic layer. A diameter of an upper surface of the first magnetic layer is smaller than a diameter of a lower surface of the tunnel barrier layer. A diameter of a lower surface of the second magnetic layer is not more than a diameter of an upper surface of the tunnel barrier layer.

An embodiment will now be described with reference to the accompanying drawings. Note that the same reference numerals denote elements having the same functions and arrangements in the following description, and a repetitive description will be made only when necessary.

First Embodiment

A magnetic memory (to be referred to as an MRAM hereinafter) according to the first embodiment will be described. The MRAM of the first embodiment includes at least one memory cell. Note that when the MRAM includes a plurality of memory cells, the plurality of memory cells are arrayed in a matrix. The memory cell comprises a magnetoresistive element as a memory element. FIG. 1 shows the magnetoresistive element. FIG. 1 is a sectional view showing a magnetoresistive element 10 according to the first embodiment. The magnetoresistive element 10 has a stacked structure in which a crystal orientation underlayer (not shown) to be described later, a recording layer (to also be referred to as a free layer hereinafter) 12 provided on the underlayer, a tunnel barrier layer (nonmagnetic layer) 13 provided on the recording layer 12, a reference layer (to also be referred to as a fixed layer hereinafter) 14 provided on the tunnel barrier layer 13, a biased magnetic field layer 16 provided on the reference layer 14, and an upper electrode (not shown) are stacked. In the following explanation, the stacked portion of the recording layer 12, the tunnel barrier layer 13, and the reference layer 14 will simply be referred to as an MTJ film. In this embodiment, the crystal orientation underlayer that is a single layer serves as both a lower electrode and a lead. However, the underlayer and the lower electrode may separately be stacked, or the underlayer and the lower electrode may be formed as a single layer while the lead may be stacked separately, as a matter of course. The upper electrode also functions as a hard mask layer. A nonmagnetic layer 15 may be provided between the reference layer 14 and the biased magnetic field layer 16, as shown in FIG. 7A to be described later.

In this embodiment, a diameter (diameter on the tunnel barrier layer side) $\phi_f$ of the recording layer 12 on the surface in contact with the tunnel barrier layer 13 is smaller than a diameter $\phi_b$ of the tunnel barrier layer 13 in a section parallel to the film surface, as shown in FIG. 1. In addition, a diameter (diameter on the tunnel barrier layer side) $\phi_r$ of the reference layer 14 on the surface in contact with the tunnel barrier layer 13 is equal to or smaller than the diameter $\phi_b$ of the tunnel barrier layer 13 and larger than the diameter $\phi_f$ of the recording layer 12 on the tunnel barrier layer side. The diameter of a layer means the maximum value of the distance between two points on the outer periphery of the layer on the surface. The "film surface" of a layer means the upper surface of the layer. Note that in the MTJ film of the embodiment shown in FIG. 1, the reference layer 14 is configured to have almost the same diameter from the upper surface to the lower surface. However, the reference layer 14 may be configured to have almost the same diameter from the upper surface to a certain plane and then increase the diameter toward the tunnel barrier layer 13, as shown in a modification of the embodiment shown in FIG. 2. In the embodiment, the diameter $\phi_f$ of the recording layer 12 on the tunnel barrier layer side is made smaller than the diameter $\phi_b$ of the tunnel barrier layer 13 in the section parallel to the film surface and the diameter $\phi_r$ of the reference layer 14 on the tunnel barrier layer side, thereby reducing the influence of the leakage magnetic field from the reference layer 14 and decrease the film thickness of the biased magnetic field layer 16, as will be described later. Decreasing the film thickness of the biased magnetic field layer 16 allows to suppress the variation in the characteristics of the magnetoresistive elements.

Figure 2:
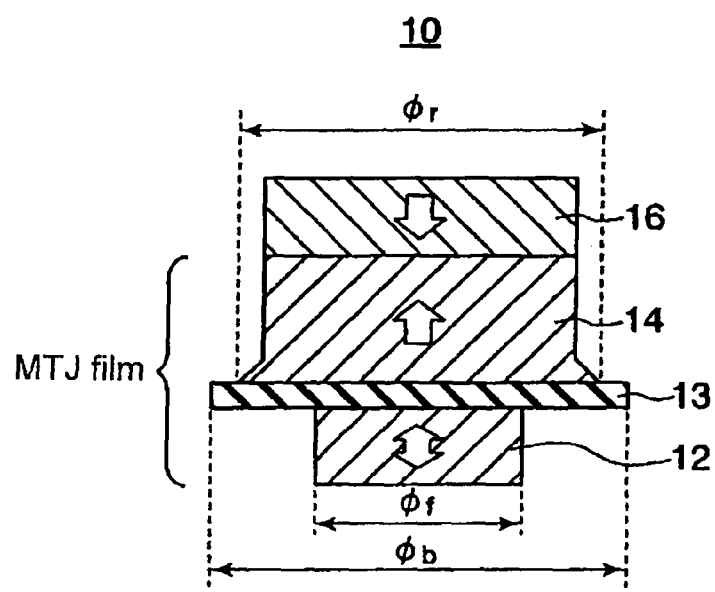
FIG. 2 is a sectional view showing a magnetoresistive element used in an MRAM according to a modification of the first embodiment.

The magnetization (or spin) direction of the recording layer 12 is reversed by supplying a current to the MTJ film in a direction perpendicular to the film surface and transmitting the angular momentum of thus generated spin-polarized electrons to the electrons in the recording layer 12. That is, the magnetization direction of the recording layer 12 can change depending on the current flowing direction. On the other hand, the magnetization directions of the reference layer 14 and the biased magnetic field layer 16 are invariable. That the magnetization directions of the reference layer 14 and the biased magnetic field layer 16 are "invariable" means that the magnetization directions of the reference layer 14 and the biased magnetic field layer 16 do not change when a magnetization reversal current is supplied to the reference layer 14 and the biased magnetic field layer 16 to reverse the magnetization direction of the recording layer 12. Hence, magnetic layers using large reversal currents are used as the reference layer 14 and the biased magnetic field layer 16, and a magnetic layer whose reversal current is smaller than those of the reference layer 14 and the biased magnetic field layer 16 is used as the recording layer 12 in the magnetoresistive element 10, the magnetoresistive element 10 comprising the recording layer 12 having a variable magnetization direction, the reference layer 14 having an invariable magnetization direction, and the biased magnetic field layer 16 having an invariable magnetization direction can be implemented. When causing magnetization reversal by spin-polarized electrons, the reversal current is proportional to the attenuation constant, the anisotropic magnetic field, and the volume of the MTJ film. A difference in the reversal current can be ensured between the recording layer 12 and the reference layer 14 by appropriately adjusting the above-described factors. Note that each arrow in FIGS. 1 and 2 represents a magnetization direction.

Each of the recording layer 12, the reference layer 14, and the biased magnetic field layer 16 has magnetic anisotropy perpendicular to the film surface. Hence, the directions of easy magnetization of the recording layer 12, the reference layer 14, and the biased magnetic field layer 16 are perpendicular to the film surfaces (or stacked surfaces) (to be referred to as perpendicular magnetization hereinafter). That is, the magnetoresistive element 10 is a so-called perpendicular magnetization type magnetoresistive element in which the magnetization directions of the recording layer 12, the reference layer 14, and the biased magnetic field layer 16 are perpendicular to the film surfaces. Note that the direction of easy magnetization is the direction of spontaneous magnetization in which the internal energy of an assumed ferromagnetic material body having a certain macro size is minimized without an external magnetic field. The direction of hard magnetization is the direction of spontaneous magnetization in which the internal energy of an assumed ferromagnetic material body having a certain macro size is maximized without an external magnetic field. Note that in this embodiment, the directions of magnetic fields in the reference layer 14 and the biased magnetic field layer 16 are set to be antiparallel (opposite) to each other.

The above-described underlayer is a layer necessary for growing a flat magnetic layer of perpendicular magnetization. For example, the underlayer has a stacked structure in which a compound layer made of titanium nitride (TiN) or the like, a metal layer made of tantalum (Ta), platinum (Pt), or the like, and a thin magnesium oxide (MgO) layer having a thickness of 0.5 nm or less are sequentially stacked.

Examples of the material of the recording layer 12, the reference layer 14, and the biased magnetic field layer 16 are a ferromagnetic material such as FePt or FePd having the L10 or L11 structure, a ferrimagnetic material such as TbCoFe, and an artificial lattice formed from a stacked structure of a magnetic material such as NiFe and a nonmagnetic material such as Cu.

An example of the material of the tunnel barrier layer 13 is an insulating material such as magnesium oxide (MgO) or aluminum oxide ($Al_2O_3$).

An example of the material of the upper electrode (hard mask layer) is a metal such as tantalum (Ta) or titanium nitride (TiN).

Note that a structure in which each of the recording layer 12, the reference layer 14, and the biased magnetic field layer 16 has magnetic anisotropy parallel to the film surface, and the directions of easy magnetization of the recording layer 12, the reference layer 14, and the biased magnetic field layer 16 are therefore parallel to the film surfaces (or stacked surfaces) (to be referred to as in-plane magnetization hereinafter) can also selectively be used as needed in accordance with the characteristic request.

An example of the material of the recording layer and the reference layer 14 of in-plane magnetization is a magnetic metal containing at least one element selected from the group consisting of iron (Fe), cobalt (Co), nickel (Ni), manganese (Mn), and chromium (Cr).

In the magnetoresistive element 10 having the above-described arrangement, information write is performed in the following way. At the time of information write, the magnetoresistive element 10 is energized bidirectionally in a direction perpendicular to the film surfaces.

When a write current is supplied from the recording layer 12 to the reference layer 14, the electrons flow from the reference layer 14 to the recording layer 12. In this case, the magnetization of the recording layer 12 receives a spin torque so as to be aligned with the magnetization direction of the reference layer 14. For this reason, when the magnetization direction of the recording layer 12 is antiparallel to the magnetization direction of the reference layer 14, the magnetization of the recording layer 12 is reversed to be parallel to (have the same direction as) the magnetization direction of the reference layer 14.

On the other hand, when the write current is supplied from the reference layer 14 to the recording layer 12, the electrons flow from the recording layer 12 to the reference layer 14. In this case, the magnetization of the recording layer 12 receives a spin torque so as to be antiparallel to the magnetization direction of the reference layer 14. For this reason, when the magnetization direction of the recording layer 12 is parallel to the magnetization direction of the reference layer 14, the magnetization of the recording layer 12 is reversed to be antiparallel to the magnetization direction of the reference layer 14.

When a read current in a direction perpendicular to the film surface is supplied to the magnetoresistive element 10, the resistance value changes depending on the relative magnetization directions of the recording layer and the reference layer because of the magnetoresistive effect. That is, when the magnetization direction of the recording layer 12 is parallel to that of the reference layer 14, the magnetoresistive element 10 has a low resistance value. When the magnetization directions are antiparallel, the magnetoresistive element 10 has a high resistance value. Referring to FIGS. 1 and 2, a state in which the magnetization of the recording layer 12 is directed upward is the parallel state, and a state in which the magnetization is directed downward is the antiparallel state. In this embodiment, for example, the low resistance state is defined as data "0", and the high resistance state is defined as data "1". This allows the magnetoresistive element 10 to store 1-bit information. Note that the low resistance state may be defined as data "1", and the high resistance state may be defined as data "0".

Let R0 be the resistance value in the parallel state, and R1 be the resistance value in the antiparallel state. A value defined by "(R1− R0/R0)" is called a magnetoresistive ratio (MR ratio). The MR ratio can take a value ranging from several ten % to several hundred %, although it changes depending on the materials of the magnetoresistive element 10 and the process conditions. The MRAM reads information stored in the magnetoresistive element 10 using the magnetoresistive effect. The read current supplied to the magnetoresistive element 10 at the time of read operation is set to a value much smaller than that of the current that reverses the magnetization direction of the recording layer 12 by spin transfer torque.

As described above, in this embodiment, the diameter $\phi_f$ of the recording layer 12 on the tunnel barrier layer side is smaller than the diameter $\phi_b$ of the tunnel barrier layer 13 in the section parallel to the film surface, as shown in FIG. 1 or 2. In addition, the diameter $\phi_r$ of the reference layer 14 on the tunnel barrier layer side is smaller than the diameter $\phi_b$ of the tunnel barrier layer 13 and larger than the diameter $\phi_f$ of the recording layer 12 on the tunnel barrier layer side. The advantages of this arrangement will be described below.

Figure 3:
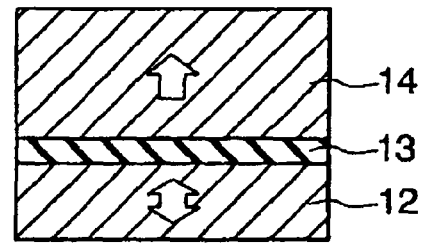
FIG. 3 is a sectional view showing a magnetoresistive element used in a comparative example of the first embodiment.

FIG. 3 illustrates an MTJ film according to a comparative example. In the MTJ film of the comparative example, since the recording layer 12, the tunnel barrier layer 13, and the reference layer 14 have the same shape, that is, the same diameter, the distance between the recording layer 12 and the reference layer 14 is short. When working the structure into this shape, the recording layer 12 and the reference layer 14 are removed together with the tunnel barrier layer 13. Hence, readherents of magnetic metals contained in the recording layer 12 and the reference layer 14 may readhere across the tunnel barrier layer 13. In this case, another leakage current path is formed by the readherents. This causes a short circuit between the recording layer 12 and the reference layer 14 and makes the magnetoresistive element defective, resulting in a decrease in the yield of magnetoresistive elements.

In this embodiment, however, the diameter $\phi_b$ of the tunnel barrier layer 13 is larger than the diameters $\phi_f$ and $\phi_r$ of the recording layer 12 and the reference layer 14 on the tunnel barrier layer side (see FIG. 1 or 2). This makes it possible to increase the physical distance between the recording layer 12 and the reference layer 14 as compared to the conventional structure and therefore suppress formation of a short path that causes a short circuit between the recording layer 12 and the reference layer 14. Alternatively, when working the tunnel barrier layer 13, the working energy may accumulate to damage the side surface of the tunnel barrier layer 13. The damage may cause an insulation failure to form a leakage path. However, the arrangement of this embodiment can maintain the insulating properties even if the side surface of the tunnel barrier layer 13 is damaged. It is therefore possible to suppress the decrease in the yield of magnetoresistive elements.

Figure 4:
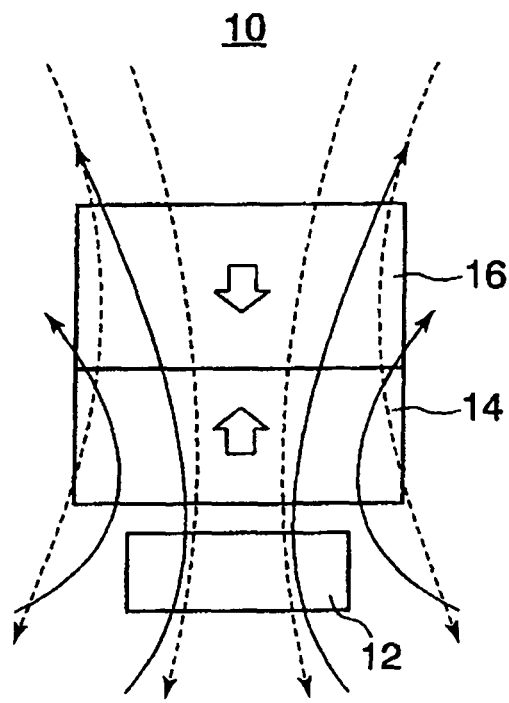
FIG. 4 is a view for explaining a state in which a biased magnetic field layer cancels a leakage magnetic field from the reference layer in the magnetoresistive element according to the first embodiment.
Figure 5:
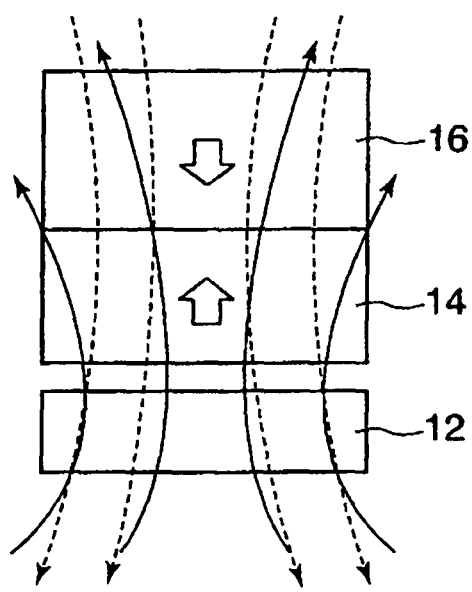
FIG. 5 is a view for explaining a state in which a biased magnetic field layer cancels a leakage magnetic field from the reference layer in the magnetoresistive element according to the comparative example.

The biased magnetic field layer 16 will be described next. The biased magnetic field layer 16 has a function of canceling the leakage magnetic field generated from the reference layer 14 and acting on the recording layer 12. "Canceling" indicates reducing the area mean of the film surface perpendicular component of the leakage magnetic field applied to the intermediate plane between the upper surface and the lower surface of the recording layer to zero. FIG. 4 is a view for explaining a state in which the biased magnetic field layer 16 cancels the leakage magnetic field generated from the reference layer 14 and acting on the recording layer 12 in the magnetoresistive element 10 according to this embodiment. FIG. 5 is a view for explaining a state in which the biased magnetic field layer 16 cancels the leakage magnetic field generated from the reference layer and acting on the recording layer 12 when the biased magnetic field layer 16 is provided in the magnetoresistive element of the comparative example in which the recording layer 12, the tunnel barrier layer, and the reference layer 14 have the same diameter. The magnetization direction of the reference layer 14 and that of the biased magnetic field layer 16 are antiparallel to each other. For this reason, when the magnetization of the reference layer 14 is directed upward, the magnetization direction of the biased magnetic field layer 16 is set downward. The solid lines indicate the leakage magnetic field generated from the reference layer 14, and the broke line arrows indicate the leakage magnetic field generated from the biased magnetic field layer 16. When the diameter $\phi_r$ of the reference layer 14 on the tunnel barrier layer side and the diameter $\phi_f$ of the recording layer 12 on the tunnel barrier layer side satisfy the condition $\phi_r > \phi_f$, as in this embodiment, the area influenced by the leakage magnetic field from the reference layer 14 to the recording layer 12 becomes small. Hence, as is apparent from FIGS. 4 and 5, the necessary leakage magnetic field from the biased magnetic field layer 16 is smaller in the magnetoresistive element 10 of this embodiment than in the magnetoresistive element of the comparative example (see FIGS. 4 and 5).

FIG. 6 shows the simulation result of the magnetization distribution in the recording layer when a biased magnetic field layer having a film thickness necessary for canceling the leakage magnetic field from the reference layer 14 in the magnetoresistive element of the comparative example in which the recording layer 12, the tunnel barrier layer, and the reference layer 14 have the same diameter is used as the biased magnetic field layer 16 of the magnetoresistive element according to this embodiment. That is, FIG. 6 shows the simulation result when the film thickness of the biased magnetic field layer 16 in the magnetoresistive element according to this embodiment is the same as the film thickness of the biased magnetic field layer 16 necessary for canceling the leakage magnetic field from the reference layer 14 in the magnetoresistive element of the comparative example. That is, when the biased magnetic field layer 16 is thick as in the comparative example, the magnetic field is exactly canceled in the region indicated by the broken lines (where the diameter of the recording layer 12 is the same as those of the reference layer 14 and the biased magnetic field layer 16). However, in the region indicated by the solid lines (where the diameter of the recording layer 12 is smaller than those of the reference layer 14 and the biased magnetic field layer 16), the influence of the negative magnetic field generated by the biased magnetic field layer 16 is large, as can be seen.

To check the influence of the film thickness of the biased magnetic field layer 16 in the magnetoresistive element of this embodiment, a simulation was conducted by obtaining a film thickness $t_2$ of the biased magnetic field layer 16 necessary for canceling the leakage magnetic field in the recording layer 12 while setting the reference layer 14, the nonmagnetic layer 15, and the biased magnetic field layer 16 to a predetermined diameter of 60 nm, fixing the film thickness of the reference layer 14, and changing a diameter D of the recording layer 12 having a film thickness of 2.4 nm. The simulation result will be explained with reference to FIGS. 7A and 7B. FIG. 7A shows the characteristics of the layers used in the simulation. FIG. 7B is a graph showing the simulation result representing the relationship between the diameter D (nm) of the recording layer 12 and the film thickness $t_2$ of the biased magnetic field layer 16. The characteristics of the layers used in the simulation are as follows. As shown in FIG. 7A, the tunnel barrier layer 13 is made of magnesium oxide (MgO) and has a film thickness of 1 nm. The reference layer 14 has a film thickness of 6 nm and a saturation magnetization $M_S$ of 400 (emu/cm$^3$). The nonmagnetic layer 15 is made of Ru and has a film thickness of 2 nm. The biased magnetic field layer 16 has the saturation magnetization $M_S$ of 1000 (emu/cm$^3$). As is apparent from FIG. 7B, when the diameter D of the recording layer 12 is the same (60 nm) as those of the reference layer 14 and the biased magnetic field layer 16 (comparative example), the biased magnetic field layer 16 needs to have a diameter of 8 nm to cancel the leakage magnetic field from the reference layer 14. In this case, the necessary film thickness $t_2$ of the biased magnetic field layer 16 is larger than the film thickness (6 nm) of the reference layer 14. In the magnetoresistive element of this case, as the diameter D of the recording layer 12 decreases, the film thickness $t_2$ of the biased magnetic field layer 16 necessary for canceling the leakage magnetic field from the reference layer 14 decreases. This indicates that to cancel the leakage magnetic field from the reference layer 14, it is necessary to decrease the film thickness $t_2$ of the biased magnetic field layer 16 as the diameter of the recording layer 12 decreases. That is, when the diameter of the recording layer 12 is smaller than that of the reference layer 14, the biased magnetic field layer 16 is made thinner to reduce the influence of the negative magnetic field generated by the biased magnetic field layer 16 and applied to the recording layer 12, thereby canceling the leakage magnetic field from the reference layer. Hence, in this embodiment, the biased magnetic field layer 16 can be thinner than the biased magnetic field layer in the magnetoresistive element of the comparative example, and a design advantageous in holding the magnetization of the reference layer 14 can be implemented. Additionally, since the reference layer can be thinner than the biased magnetic field layer, the variation in the characteristics of the magnetoresistive elements can be suppressed.

As described above, according to this embodiment, it is possible to suppress the variation in the characteristics of the magnetoresistive elements and reduce the leakage magnetic field generated from the reference layer and acting on the recording layer.

Second Embodiment

A method of manufacturing an MRAM according to the second embodiment will be described next with reference to FIGS. 8A, 8B, 9, 10, 11, 12, 13, 14, 15, 16A, and 16B. The MRAM manufactured by the manufacturing method of this embodiment is the MRAM according to the first embodiment which includes a magnetoresistive element 10 shown in FIG. 1 as a memory element.

First, as shown in FIG. 8A, an interlayer dielectric film 21 is formed on a MOS transistor or FEOL (Front End Of Line) formed on a semiconductor substrate (not shown). A contact 22 to be electrically connected to a lower interconnection, a MOS transistor, or the like is formed in the interlayer dielectric film 21. Note that the contact 22 is formed at a position different from the position where the magnetoresistive element 10 to be described later is formed. FIGS. 8A, 8B, 9, 10, 11, 12, 13, 14, 15, 16A, and 16B are sectional views at the position where the magnetoresistive element 10 is formed. After that, the upper surface is planarized by CMP (Chemical Mechanical Polishing) and etch-back. As the interlayer dielectric film 21, for example, silicon oxide (SiO$_2$) is used. As the contact 22, for example, tungsten (W) is used.

As shown in FIG. 8B, an underlayer 11, an MTJ film, a biased magnetic field layer 16, and an electrode hard mask layer 18 serving as the upper electrode are sequentially formed by, for example, sputtering so as to cover the contact 22. The underlayer 11 is a layer that is connected to the contact 22 and is necessary for growing a flat magnetic layer of perpendicular magnetization, and is made of the above-described material. The MTJ film includes a recording layer 12, a tunnel barrier layer 13, and a reference layer 14 from the lower side. As the material of the recording layer 12 and the reference layer 14, for example, FePd having the L11 structure is used. As the tunnel barrier layer 13, for example, magnesium oxide (MgO) is used. As the hard mask layer 18, for example, tantalum (Ta) is used. A thin nonmagnetic layer made of magnesium oxide (MgO), ruthenium (Ru), or the like may be inserted between the MTJ film and the biased magnetic field layer 16. A saturation magnetization $M_S$ of the biased magnetic field layer 16 is set to be almost equal to or more than the saturation magnetization of the reference layer 14.

Next, element isolation is done by lithography and etching that are known techniques. A mask (not shown) made of a photoresist is formed on the hard mask 18. The hard mask layer 18, the biased magnetic field layer 16, and the reference layer 14 are patterned by anisotropic etching (for example, RIE (Reactive Ion Etching)) using the mask, thereby exposing a partial region of the tunnel barrier layer 13, as shown in FIG. 9.

Figure 10:
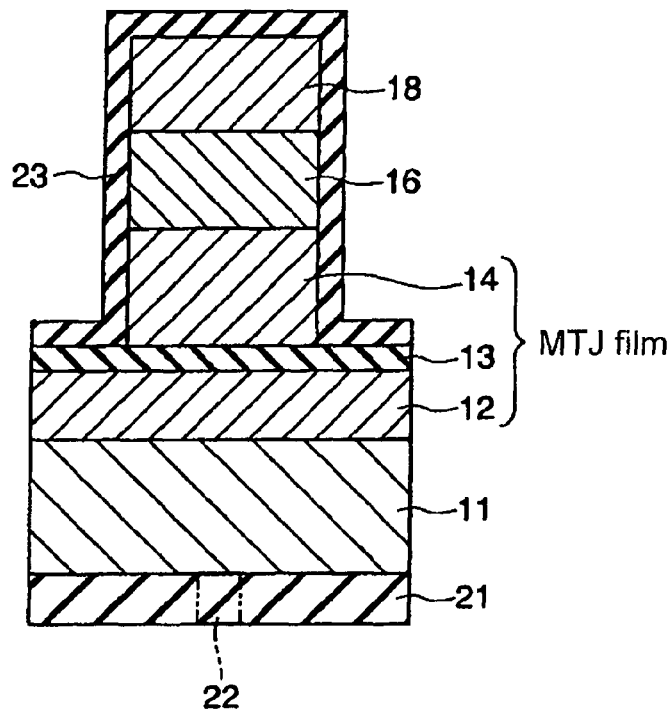
FIG. 10 is a sectional view showing the manufacturing method according to the second embodiment.
Figure 11:
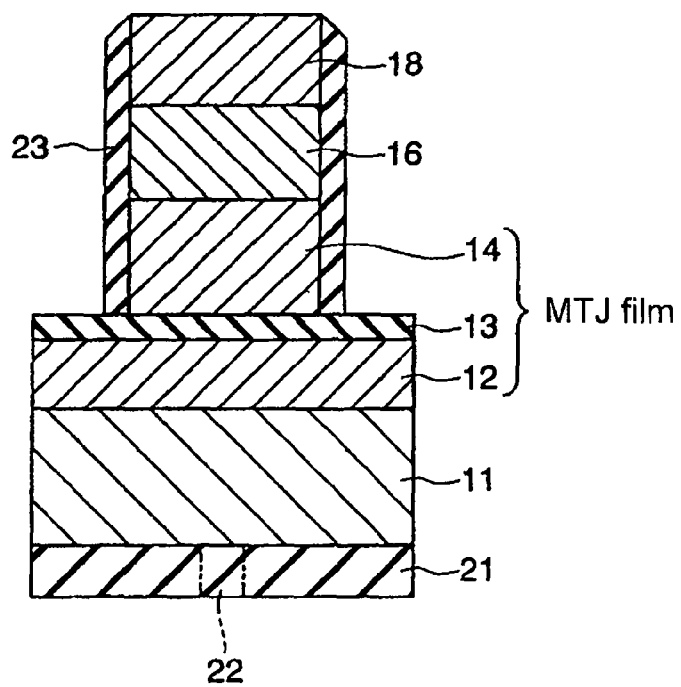
FIG. 11 is a sectional view showing the manufacturing method according to the second embodiment.

Next, as shown in FIG. 10, an insulating film 23 is deposited to cover the stacked film of the reference layer 14, the biased magnetic field layer 16, and the hard mask layer 18 and the exposed region of the tunnel barrier layer 13. As the insulating film 23, for example, silicon oxide ($SiO_2$) or silicon nitride (SiN) is used. Subsequently, as shown in FIG. 11, the insulating film 23 is etched by anisotropic etching (for example, RIE) to expose the upper surface of the stacked film of the reference layer 14, the biased magnetic field layer 16, and the hard mask layer 18 and the upper surface of the exposed region of the tunnel barrier layer 13. At this time, the reference layer 14 and the biased magnetic field layer 16 are worked such that their side surfaces are protected by the insulating film 23 and not exposed, that is, the insulating film 23 is left on the side surfaces. Hence, a side wall made of the insulating film 23 is formed on the side surfaces of the reference layer 14 and the biased magnetic field layer 16. Note that the insulating film 23 may be either left on or removed from the side surface of the hard mask layer 18.

As shown in FIG. 12, the tunnel barrier layer 13, the recording layer 12, and the underlayer 11 are partially patterned using, as a mask, the insulating film 23 serving as the side wall and the hard mask layer 18. That is, the tunnel barrier layer 13 is worked so as to have a diameter larger than that of the reference layer 14 by the size of the insulating film 23 serving as the side wall. In addition, the underlayer 11 is patterned at the position close to the recording layer 12, and the portion close to the interlayer dielectric film 21 is not patterned. Note that the underlayer 14 may be patterned so as to have the same diameter from the upper surface to the lower surface.

As shown in FIG. 13, the recording layer 12 and the underlayer are partially worked using ion milling from the side surface direction or RIE with a high selectivity such that they have a diameter smaller than that of the reference layer 14. At this time, the insulating film 23 serving as the side wall is also worked to be thinner. Hence, the film thickness of the insulating film 23 upon deposition is designed not to expose the side surface of the reference layer 14.

Figure 14:
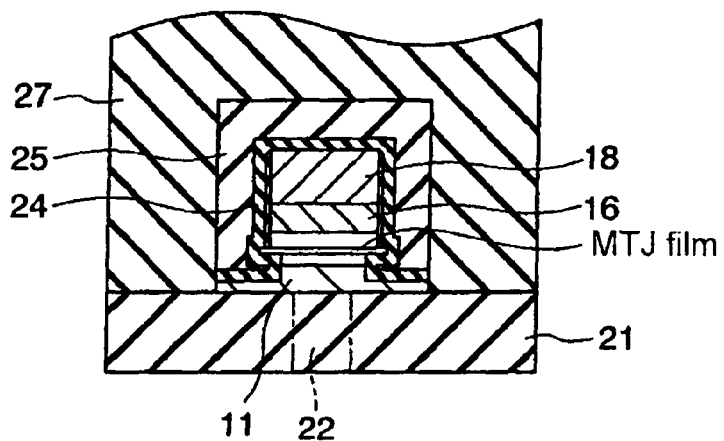
FIG. 14 is a sectional view showing the manufacturing method according to the second embodiment.

As shown in FIG. 14, the surface of the stacked film including the underlayer 11, the MTJ film, the biased magnetic field layer 16, and the hard mask layer 18 is covered with a thin insulating film 24. This process is performed without forming a gap between the stacked film and the insulating film 24. If a gap exists, it may expand and damage the magnetoresistive element and thus degrade the characteristics upon annealing and the like to be executed later. After the insulating film 24 is formed, an interlayer dielectric film 25 made of, for example, silicon oxide ($SiO_2$) or silicon nitride (SiN) is deposited on the entire surface. The upper surface of the interlayer dielectric film 25 is planarized using, for example, CMP. For electrical isolation from adjacent memory cells, a mask made of, for example, a photoresist is formed on the planarized upper surface of the interlayer dielectric film 25. The interlayer dielectric film 25, the insulating film 24, and the underlayer 11 are patterned by anisotropic etching using the mask. After that, another interlayer dielectric film 27 is formed to cover the patterned interlayer dielectric film 25, insulating film 24, and underlayer 11.

Figure 15:
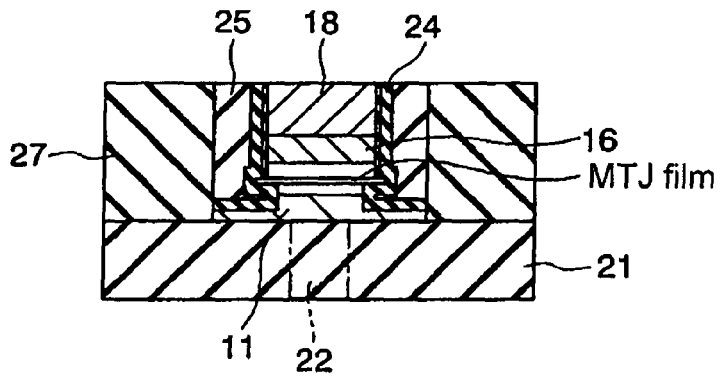
FIG. 15 is a sectional view showing the manufacturing method according to the second embodiment.

As shown in FIG. 15, the interlayer dielectric film 27 is planarized by CMP. In addition, the interlayer dielectric film 27, the interlayer dielectric film 25, and the insulating film 24 are further removed to expose the upper surface of the hard mask layer 18 on the MTJ film.

Figure 16A:
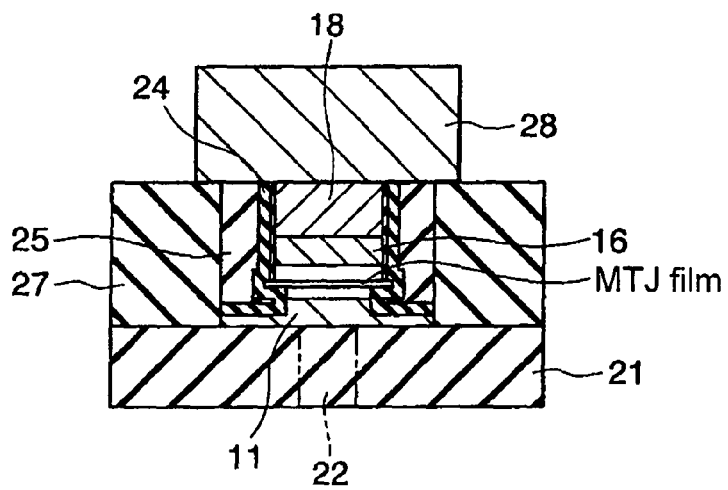
FIG. 16A is a sectional view showing the manufacturing method according to the second embodiment.

As shown in FIG. 16A, an upper interconnection 28 to be electrically connected to the hard mask layer 18 is formed on the magnetoresistive element 10. As the upper interconnection 28, for example, aluminum (Al) or copper (Cu) is used. In this way, the memory cell of the MRAM of the first embodiment is formed by the manufacturing method of the second embodiment. FIG. 16B is a plan view of the magnetoresistive element 10 at this time. As is apparent from FIG. 16B, the position where the magnetoresistive element 10 is formed is different from the position where the contact 22 is formed.

In this embodiment, the memory cell can also be formed by working the structure up to the recording layer 12 at once and then performing side etching by ion milling or the like using the directivity and material selectivity at the time of work of the magnetoresistive element. In this case, the ion milling rate preferably satisfies material of recording layer>material of reference layer>material of barrier layer.

The MRAM manufactured by the manufacturing method of this embodiment can suppress the variation in the characteristics of the magnetoresistive elements and reduce the leakage magnetic field generated from the reference layer and acting on the recording layer, as in the first embodiment. In addition, the decrease in the yield caused by the short circuit between the recording layer and the reference layer can also be suppressed, as in the first embodiment.

In the manufacturing method of this embodiment, the magnetoresistive element having a stacked structure in which the recording layer 12, the tunnel barrier layer 13, the reference layer 14, and the biased magnetic field layer 15 are stacked in this order on the underlayer 11 is manufactured. A magnetoresistive element having a stacked structure in which the biased magnetic field layer 15, the reference layer 14, the tunnel barrier layer 13, and the recording layer 12 are stacked in this order on the underlayer 11 can also be manufactured. In this case, first, the biased magnetic field layer 15, the reference layer 14, the tunnel barrier layer 13, and the recording layer 12 are sequentially formed on the underlayer 11. A hard mask is formed on the recording layer 12, and the recording layer 12 is patterned using the hard mask. This patterning stops on the upper surface of the tunnel barrier layer 13. After that, a side wall made of an insulating film is formed on the side portion of the recording layer 12. The tunnel barrier layer 13, the reference layer 14, and the biased magnetic field layer 16 are patterned using the side wall and the hard mask, thereby completing the magnetoresistive element. Then, the magnetoresistive elements are divided for each memory cell, and an interlayer dielectric film is deposited, as in this embodiment. The MRAM manufactured by this manufacturing method can also suppress the variation in the characteristics of the magnetoresistive elements and reduce the leakage magnetic field generated from the reference layer and acting on the recording layer, as in the first embodiment. In addition, the decrease in the yield caused by the short circuit between the recording layer and the reference layer can also be suppressed, as in the first embodiment.

Third Embodiment

A method of manufacturing an MRAM according to the third embodiment will be described next with reference to FIGS. 17, 18, 19, 20, and 21. The MRAM manufactured by the manufacturing method of this embodiment is the MRAM according to the modification of the first embodiment which includes a magnetoresistive element 10 shown in FIG. 2 as a memory element. Note that FIGS. 17, 18, 19, 20, and 21 are sectional views showing steps in the manufacture of the MRAM to be manufactured by the manufacturing method according to this embodiment, in which the layer under the underlayer is not illustrated for the descriptive convenience.

The element is formed in accordance with the same procedure as in the second embodiment up to the process before that in FIG. 9. Next, element isolation is done by lithography and etching. In this element isolation, a hard mask layer 18, a biased magnetic field layer 16, and a reference layer 14 are partially patterned by ion milling, as shown in FIG. 17. The ion milling is stopped when the patterning of the reference layer 14 has come close to the region near a tunnel barrier layer 13. By the working characteristic of the ion milling, the remaining portion of the reference layer 14 (the region near the tunnel barrier layer 13), the tunnel barrier layer 13, and a recording layer 12 are also removed. For this reason, the remaining portion of the reference layer 14 (the region near the tunnel barrier layer 13), the tunnel barrier layer 13, and the recording layer 12 have a tapered shape that gradually increases the diameter from the region of the reference layer 14 near the tunnel barrier layer 13 to the lower surface of the recording layer 12. Hence, in the manufacturing method of this embodiment, the etching action is more dominant than the readhesion (redeposition) action because of the taper angle near the tunnel barrier layer 13, and the recording layer 12 and the reference layer 14 do not short-circuit.

Next, as shown in FIG. 18, an insulating film 23 is deposited to cover the stacked film of the reference layer 14, the biased magnetic field layer 16, and the hard mask layer 18 and the exposed region of the tunnel barrier layer 13. As the insulating film 23, for example, silicon oxide ($SiO_2$) or silicon nitride (SiN) is used. Subsequently, as shown in FIG. 19, the insulating film 23 is etched by anisotropic etching to expose the upper surface of the stacked film of the reference layer 14, the biased magnetic field layer 16, and the hard mask layer 18 and the upper surface of the recording layer 12. At this time, the side wall made of the insulating film 23 is left on the side surfaces of the reference layer 14 and the biased magnetic field layer 16. Hence, the side surfaces of the reference layer 14 and the biased magnetic field layer 16 are protected by the insulating film 23 and not exposed. Note that the insulating film 23 may be either left on or removed from the side surface of the hard mask layer 18.

As shown in FIG. 20, the tunnel barrier layer 13 and the recording layer 12 are patterned using the hard mask layer 18 and the side wall made of the insulating film 23 as a mask. At this time, since the tunnel barrier layer 13 and the recording layer 12 are patterned using the mask whose size is increased by the thickness of the insulating film 23 formed on the side surface of the reference layer 14, the tunnel barrier layer 13 is worked so as to have a diameter larger than that of the reference layer 14.

As shown in FIG. 21, the recording layer 12 is worked using ion milling from the side surface direction or RIE with a high selectivity such that it has a diameter smaller than that of the reference layer 14. The film thickness of the insulating film 23 upon deposition is designed not to expose the side surface of the reference layer 14 at this time.

The same processes as those shown in FIGS. 13, 14, 15, and 16A of the second embodiment are performed, thereby forming the memory cell of the MRAM according to the modification of the first embodiment having the MTJ element shown in FIG. 1 as a memory element.

The MRAM manufactured by the manufacturing method of this embodiment can also suppress the variation in the characteristics of the magnetoresistive elements and reduce the leakage magnetic field generated from the reference layer and acting on the recording layer, as in the first embodiment. In addition, the decrease in the yield caused by the short circuit between the recording layer and the reference layer can also be suppressed, as in the first embodiment.

Fourth Embodiment

A magnetic memory (MRAM) according to the fourth embodiment will be described next with reference to FIGS. 22 and 23.

FIG. 22 is a circuit diagram of the MRAM according to this embodiment. The MRAM of this embodiment uses, as the memory element of a memory cell, a magnetoresistive element 10 shown in FIG. 1 or 2 described in the first embodiment or the modification of the first embodiment. This MRAM comprises a memory cell array 30 including a plurality of memory cells MC arrayed in a matrix. A plurality of pairs of bit lines BL and /BL are formed on the memory cell array 30 so as to run in the column direction. In addition, a plurality of word lines WL are formed on the memory cell array 30 so as to run in the row direction.

The memory cells MC are arranged at the intersections between the bit lines BL and the word lines WL. Each memory cell MC comprises the magnetoresistive element 10, and a select transistor 31 formed from an NMOS transistor. One terminal of the magnetoresistive element 10 is connected to the bit line BL. The other terminal of the magnetoresistive element 10 is connected to the drain terminal of the select transistor 31. The gate terminal of the select transistor 31 is connected to the word line WL. The source terminal of the select transistor 31 is connected to the bit line /BL.

A row decoder 32 is connected to the word lines WL. A write circuit 34 and a read circuit 35 are connected to the pairs of bit lines BL and /BL. A column decoder 33 is connected to the write circuit 34 and the read circuit 35. Each memory cell MC is selected by the row decoder 32 and the column decoder 33.

Data write to the memory cell MC is performed in the following way. First, to select the memory cell MC for the data write, the word line WL connected to the memory cell MC is activated. The select transistor 31 is thus turned on. A bidirectional write current Iw is supplied to the magnetoresistive element 10 based on the write data. More specifically, to supply the write current Iw to the magnetoresistive element 10 from left to right in FIG. 22, the write circuit 34 applies a positive voltage to the bit line BL and the ground voltage to the bit line /BL. To supply the write current Iw to the magnetoresistive element 10 from right to left in FIG. 22, the write circuit 34 applies a positive voltage to the bit line /BL and the ground voltage to the bit line BL. Data "0" or data "1" can thus be written to the memory cell MC.

Data read from the memory cell MC is performed in the following way. First, to select the memory cell MC for the data read, the word line WL connected to the memory cell MC is activated. The select transistor 31 of the selected memory cell MC is thus turned on. The read circuit 35 supplies a read current Ir flowing, for example, from right to left in FIG. 22 to the magnetoresistive element 10. The read circuit 35 detects the resistance value of the magnetoresistive element 10 based on the read current Ir. Data stored in the magnetoresistive element 10 can thus be read.

The structure of the MRAM will be described next. FIG. 23 is a sectional view showing the arrangement of the MRAM with focus on one memory cell MC.

An element isolation layer 41 is provided in the surface region of a semiconductor substrate 40. A surface region of the semiconductor substrate 40 where the element isolation layer 41 is not provided is the element region (active area) where the element is formed. The element isolation layer 41 is formed from, for example, STI (Shallow Trench Isolation). As the STI, for example, silicon oxide is used.

The select transistor 31 is formed in the element region of the semiconductor substrate 40. The select transistor 31 is provided with a source region 42a and a drain region 42b which are spaced part from each other. Each of the source region 42a and the drain region 42b is made of an n$^+$-type diffusion region formed by heavily doping the semiconductor substrate 40 with an n$^+$-type impurity. A gate insulating film 51 is formed on the region of the semiconductor substrate 40 as a prospective channel 43 between the source region 42a and the drain region 42b. A gate electrode 52 is provided on the gate insulating film 51.

The gate electrode 52 functions as the word line WL.

An interconnection layer 63 is provided on the source region 42a via a contact 62. The interconnection layer 63 functions as the bit line /BL. A lead 65 is provided on the drain region 42b via a contact 64. The magnetoresistive element 10 sandwiched between a lower electrode 71 and an upper electrode 72 is provided on the lead 65. An interconnection layer 76 is provided on the upper electrode 72. The interconnection layer 76 functions as the bit line BL. The space between the semiconductor substrate 40 and the interconnection layer 76 is filled with an interlayer dielectric film 67 made of, for example, silicon oxide.

According to this embodiment, the MRAM can be formed using the magnetoresistive element 10 according to one of the first embodiment and the modification thereof. Note that the magnetoresistive element 10 is usable not only for a spin transfer torque magnetic memory but also for a domain wall motion magnetic memory.

In this embodiment as well, it is possible to suppress the variation in the characteristics of the magnetoresistive elements and reduce the leakage magnetic field generated from the reference layer and acting on the recording layer, as in the first embodiment.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic memory including at least one memory cell, the memory cell comprises
a magnetoresistive element serving as a memory element, and
a first electrode and a second electrode which are electricity connected to the magnetoresistive element,
the magnetoresistive element comprises
a first magnetic layer having a magnetization direction that is substantially perpendicular to a film surface and variable,
a tunnel barrier layer provided on the first magnetic layer,
a second magnetic layer provided on the tunnel barrier layer and having a magnetization direction that is substantially perpendicular to a film surface and invariable, and
a third magnetic layer provided on the second magnetic layer and having a magnetization antiparallel to the magnetization direction of the second magnetic layer, and
a diameter of an upper surface of the first magnetic layer is smaller than a diameter of a lower surface of the tunnel barrier layer, and
a diameter of a lower surface of the second magnetic layer is not more than a diameter of an upper surface of the tunnel barrier layer.

2. The magnetic memory according to claim 1, wherein each of the first magnetic layer, the second magnetic layer, and the third magnetic layer has magnetic anisotropy in a substantially vertical direction.

3. The magnetic memory according to claim 2, wherein a saturation magnetization of the third magnetic layer is not less than a saturation magnetization of the second magnetic layer.

4. The magnetic memory according to claim 2, wherein the diameter of the lower surface of the second magnetic layer is larger than the diameter of the upper surface of the first magnetic layer.

5. The magnetic memory according to claim 1, wherein the second magnetic layer has a smaller diameter on an upper surface than on the lower surface.

6. The magnetic memory according to claim 1, wherein a nonmagnetic layer is provided between the second magnetic layer and the third magnetic layer.

7. The magnetic memory according to claim 1, further comprising:
a first interconnection electrically connected to the first electrode;
a second interconnection electrically connected to the second electrode; and
a write circuit electrically connected to the first interconnection and the second interconnection and configured to bidirectionally supply a current to the magnetoresistive element.

8. The magnetic memory according to claim 7, further comprising:
a select transistor provided between the second electrode and the second interconnection; and
a third interconnection configured to on/off-control the select transistor.

9. A magnetic memory including at least one memory cell, the memory cell comprises
a magnetoresistive element serving as a memory element, and
a first electrode and a second electrode which are electricity connected to the magnetoresistive element,
the magnetoresistive element comprises
a first magnetic layer,
a second magnetic layer provided on the first magnetic layer, having a magnetization direction that is substantially perpendicular to a film surface and invariable, and having a magnetization antiparallel to a magnetization direction of the first magnetic layer,
a tunnel barrier layer provided on the second magnetic layer, and
a third magnetic layer provided on the tunnel barrier layer and having a magnetization direction that is substantially perpendicular to a film surface and variable, and a diameter of a lower surface of the third magnetic layer is smaller than a diameter of an upper surface of the tunnel barrier layer, and a diameter of an upper surface of the second magnetic layer is not more than a diameter of a lower surface of the tunnel barrier layer.

* * * * *